(12) United States Patent
Nguyen

(10) Patent No.: US 12,224,748 B2
(45) Date of Patent: *Feb. 11, 2025

(54) INTEGRATED CIRCUIT WITH CONFIGURABLE ON-DIE TERMINATION

(71) Applicant: Rambus Inc., San Jose, CA (US)

(72) Inventor: Huy Nguyen, San Jose, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,032

(22) Filed: Nov. 7, 2023

(65) Prior Publication Data
US 2024/0146304 A1    May 2, 2024

Related U.S. Application Data

(63) Continuation of application No. 17/235,283, filed on Apr. 20, 2021, now Pat. No. 11,843,372, which is a continuation of application No. 16/856,645, filed on Apr. 23, 2020, now Pat. No. 11,012,071, which is a continuation of application No. 16/290,749, filed on Mar. 1, 2019, now Pat. No. 10,651,848, which is a continuation of application No. 15/612,455, filed on Jun. 2, 2017, now Pat. No. 10,236,882, which is a continuation of application No. 15/134,513, filed on Apr. 21, 2016, now Pat. No. 9,685,951, which is a continuation of application No. 14/598,990, filed on Jan. 16, 2015, now Pat. No. 9,338,037, which is a
(Continued)

(51) Int. Cl.
*H03K 19/00* (2006.01)
*H04B 1/04* (2006.01)
*H04L 25/02* (2006.01)

(52) U.S. Cl.
CPC ....... *H03K 19/0005* (2013.01); *H04B 1/0458* (2013.01); *H04L 25/0278* (2013.01); *H04L 25/0298* (2013.01)

(58) Field of Classification Search
None
See application file for complete search history.

(56) References Cited

U.S. PATENT DOCUMENTS

| 4,584,695 A | 4/1986 | Wong et al. |
| 4,590,396 A | 5/1986 | Koike |

(Continued)

FOREIGN PATENT DOCUMENTS

| EP | 0520687 | 12/1992 |
| EP | 0817441 | 1/1998 |

(Continued)

OTHER PUBLICATIONS

Black, Mike, "Xilinx/Micron Partner to Provide High-Speed Memory Interfaces." Xcell Journal, First Quarter 2005. 2 pages.

(Continued)

*Primary Examiner* — Anh Q Tran
(74) *Attorney, Agent, or Firm* — Silicon Edge Law Group LLP; Arthur J. Behiel

(57) ABSTRACT

Described are integrated-circuit die with differential receivers, the inputs of which are coupled to external signal pads. Termination legs coupled to the signal pads support multiple termination topologies. These termination legs can support adjustable impedances, capacitances, or both, which may be controlled using an integrated memory.

20 Claims, 3 Drawing Sheets

Related U.S. Application Data continuation of application No. 13/906,219, filed on May 30, 2013, now Pat. No. 8,941,407, which is a continuation of application No. 13/312,762, filed on Dec. 6, 2011, now Pat. No. 8,466,709, which is a continuation of application No. 13/023,993, filed on Feb. 9, 2011, now Pat. No. 8,072,235, which is a continuation of application No. 12/790,381, filed on May 28, 2010, now Pat. No. 7,948,262, which is a continuation of application No. 12/288,612, filed on Oct. 21, 2008, now Pat. No. 7,772,876, which is a continuation of application No. 11/313,054, filed on Dec. 19, 2005, now Pat. No. 7,439,760.

(56) References Cited

U.S. PATENT DOCUMENTS

| | | |
|---|---|---|
| 5,254,883 A | 10/1993 | Horowitz et al. |
| 5,298,800 A | 3/1994 | Dunlop |
| 5,396,028 A | 3/1995 | Tomassetti |
| 5,406,147 A | 4/1995 | Coyle |
| 5,467,455 A | 11/1995 | Gay et al. |
| 5,523,703 A | 6/1996 | Yamamoto et al. |
| 5,528,168 A | 6/1996 | Kleveland |
| 5,544,067 A | 8/1996 | Rostoker |
| 5,663,661 A | 9/1997 | Dillon et al. |
| 5,666,078 A | 9/1997 | Lamphier et al. |
| 5,680,060 A | 10/1997 | Banniza |
| 5,726,582 A | 3/1998 | Hedberg |
| 5,781,028 A | 7/1998 | Decuir |
| 5,926,031 A | 7/1999 | Wallace |
| 5,939,986 A | 8/1999 | Schiffbauer et al. |
| 5,969,658 A | 10/1999 | Naylor |
| 5,982,191 A | 11/1999 | Starr |
| 5,995,894 A | 11/1999 | Wendte |
| 6,028,484 A | 2/2000 | Cole |
| 6,040,714 A | 3/2000 | Klein |
| 6,060,907 A | 5/2000 | Vishwanthaiah et al. |
| 6,064,224 A | 5/2000 | Esch, Jr. |
| 6,072,943 A | 6/2000 | Gasparik et al. |
| 6,157,206 A | 12/2000 | Taylor et al. |
| 6,232,792 B1 | 5/2001 | Starr |
| 6,266,001 B1 | 7/2001 | Fang |
| 6,288,564 B1 | 9/2001 | Hedberg |
| 6,308,232 B1 | 10/2001 | Gasbarro |
| 6,344,765 B2 | 2/2002 | Taguchi |
| 6,353,334 B1 | 3/2002 | Schultz et al. |
| 6,356,105 B1 | 3/2002 | Volk |
| 6,356,106 B1 | 3/2002 | Greef et al. |
| 6,366,128 B1 | 4/2002 | Ghia et al. |
| 6,411,122 B1 | 6/2002 | Mughal |
| 6,418,500 B1 | 7/2002 | Gai |
| 6,424,170 B1 | 7/2002 | Raman |
| 6,448,813 B2 | 9/2002 | Donnelly et al. |
| 6,462,588 B2 | 10/2002 | Lau et al. |
| 6,462,591 B2 | 10/2002 | Garret et al. |
| 6,495,997 B2 | 12/2002 | Hall et al. |
| 6,509,756 B1 | 1/2003 | Yu et al. |
| 6,525,558 B2 | 2/2003 | Kim |
| 6,530,062 B1 | 3/2003 | Donnelly et al. |
| 6,535,047 B2 | 3/2003 | Mughal et al. |
| 6,545,522 B2 | 4/2003 | Mughal |
| 6,552,565 B2 | 4/2003 | Chang |
| 6,573,746 B2 | 6/2003 | Kim |
| 6,573,747 B2 | 6/2003 | Radhakrishnan |
| 6,608,507 B2 | 8/2003 | Garret et al. |
| 6,661,250 B2 | 12/2003 | Kim |
| 6,711,073 B2 | 3/2004 | Martin |
| 6,734,702 B1 | 5/2004 | Ikeoku et al. |
| 6,762,620 B2 | 7/2004 | Jang et al. |
| 6,768,352 B1 | 7/2004 | Maher |
| 6,781,405 B2 | 8/2004 | Rajan et al. |
| 6,806,728 B2 | 10/2004 | Nguyen et al. |
| 6,856,169 B2 | 2/2005 | Frans et al. |
| 6,888,370 B1 | 5/2005 | Luo et al. |
| 6,894,691 B2 | 5/2005 | Juenger |
| 6,924,660 B2 | 8/2005 | Nguyen et al. |
| 6,940,303 B2 | 9/2005 | Vargas |
| 6,965,529 B2 | 11/2005 | Zumkehr et al. |
| 6,968,413 B2 | 11/2005 | Cranford, Jr. et al. |
| 6,980,020 B2 | 12/2005 | Best et al. |
| 6,981,089 B2 | 12/2005 | Dodd et al. |
| 7,038,498 B2 | 5/2006 | Funaba |
| 7,042,254 B2 | 5/2006 | Hori |
| 7,068,064 B1 | 6/2006 | Yen |
| 7,102,200 B2 | 9/2006 | Fan et al. |
| 7,102,390 B2 | 9/2006 | Frans et al. |
| 7,109,744 B1 | 9/2006 | Shumarayev et al. |
| 7,120,390 B2 | 10/2006 | Grundvig et al. |
| 7,123,047 B2 | 10/2006 | Lim |
| 7,135,884 B1 | 11/2006 | Talbot |
| 7,148,721 B2 | 12/2006 | Park |
| 7,151,390 B2 | 12/2006 | Nguyen et al. |
| 7,161,378 B2 | 1/2007 | Kang et al. |
| 7,196,567 B2 | 3/2007 | Nguyen |
| 7,245,146 B2 | 7/2007 | Ishizuka et al. |
| 7,245,154 B1 | 7/2007 | Davidson et al. |
| 7,268,712 B1 | 9/2007 | Shen |
| 7,301,371 B2 | 11/2007 | Kim |
| 7,342,411 B2 | 3/2008 | Vergis et al. |
| 7,750,666 B2 | 7/2010 | Zhang et al. |
| 7,772,876 B2 * | 8/2010 | Nguyen ............ H04L 25/0278 326/86 |
| 7,843,212 B2 | 11/2010 | Tanaka |
| 7,948,262 B2 | 5/2011 | Nguyen |
| 7,965,104 B2 | 6/2011 | Ishibashi |
| 8,072,235 B2 | 12/2011 | Nguyen |
| 8,798,204 B2 | 8/2014 | Chen et al. |
| 9,281,816 B2 | 3/2016 | Amirkhany et al. |
| 9,338,037 B2 | 5/2016 | Nguyen |
| 9,871,516 B2 | 1/2018 | Jeong et al. |
| 9,935,606 B1 | 4/2018 | Lin |
| 10,291,275 B2 | 5/2019 | Lee et al. |
| 11,184,196 B1 | 11/2021 | Yang et al. |
| 2001/0047450 A1 | 11/2001 | Gillingham et al. |
| 2002/0130680 A1 | 9/2002 | Meyer et al. |
| 2003/0112751 A1 | 6/2003 | Yuffe et al. |
| 2003/0146772 A1 | 8/2003 | Chansungsan |
| 2004/0000924 A1 | 1/2004 | Best et al. |
| 2004/0124850 A1 | 7/2004 | Koneru |
| 2004/0189343 A1 | 9/2004 | Jang |
| 2004/0201402 A1 | 10/2004 | Rajan et al. |
| 2004/0222834 A1 | 11/2004 | Frans et al. |
| 2004/0246026 A1 | 12/2004 | Wang et al. |
| 2005/0057275 A1 | 3/2005 | Nguyen et al. |
| 2005/0225353 A1 | 10/2005 | Kwon |
| 2005/0275425 A1 | 12/2005 | Lee |
| 2006/0007761 A1 | 1/2006 | Ware et al. |
| 2006/0071683 A1 | 4/2006 | Best et al. |
| 2006/0077731 A1 | 4/2006 | Ware et al. |
| 2007/0007992 A1 | 1/2007 | Bains et al. |
| 2007/0070717 A1 | 3/2007 | Kim |
| 2007/0085562 A1 | 4/2007 | Nguyen et al. |
| 2010/0066404 A1 | 3/2010 | Zhang et al. |
| 2011/0019760 A1 | 1/2011 | Nguyen |
| 2011/0267101 A1 | 11/2011 | Oh et al. |
| 2012/0187978 A1 | 7/2012 | Fazeel et al. |
| 2018/0004281 A1 | 1/2018 | Kang et al. |

FOREIGN PATENT DOCUMENTS

| | | |
|---|---|---|
| JP | 02-140676 | 5/1990 |
| WO | WO-1997-002658 | 1/1997 |
| WO | WO-1998-004041 | 1/1998 |
| WO | WO-2000-041300 | 7/2000 |
| WO | WO-2000-070474 | 11/2000 |
| WO | WO-02/063833 A2 | 8/2002 |

(56) References Cited

FOREIGN PATENT DOCUMENTS

| WO | WO-2004-061690 A3 | 7/2004 |
|---|---|---|
| WO | WO-2005-119471 | 12/2005 |

OTHER PUBLICATIONS

Cao, T. et al. "On-Chip Programmable Termination Scheme." IP.Com PriorArt Database—Technical Disclosure, Original Publication date . vol. 38 No. 02, Feb. 1, 1995. 4 Pages.

DE Office Action dated Jun. 3, 2011 re DE Application No. 112006003478.2. 11 Pages.

DE Response dated Nov. 23, 2011 to the Office Action dated Jun. 3, 2011 re DE Application No. 112006003478.2. 30 Pages.

Dell Computer Corporation et al., "Serial ATA II: Electrical Specification," Rev. 1, May 26, 2004. 187 pages.

Elpida Memory, Inc., "512M bits DDR3 SDRAM," Preliminary Data Sheet, Document No. E0785E11, Ver. 1.1, Feb. 2006, www.elpida.com. 4 pages.

Ethirajan et al., "Termination Techniques for High-Speed buses," EDN Magazine, Issue 04, Feb. 16, 1998. 9 pages.

Farrell, Todd, "Core Architecture Doubles MEM Data Rate," in Electronic Engineering Times Asia, Dec. 16, 2005. 4 pages.

Gabara et al., "Digitally Adjustable Resistors in CMOS for High-Performance Applications," IEEE Journal of Solid-State Circuits, vol. 27, No. 8, Aug. 1992. 10 pages.

Gabara, Thaddeus J., "On-Chip Terminating Resistors for High Speed ECL-CMOS Interfaces." Feb. 1992. IEEE, p. 292-295. 4 pages.

Gervasi, Bill, "DRAM Module Market Overview," SimpleTech, JEDEX Shanghai, Oct. 25-26, 2005. 50 pages.

Huq, Syed B., et al., "An Overview of LVDS Technology." 1998 National Semiconductor Corporation. 12 pages.

Hynix Semiconductor, "JEDEX Shanghai 2005," Oct. 2005. 24 pages.

Janzen, Jeff, "DDR2 Offers New Features and Functionality," Designline, vol. 12, Issue 2, Micron, Jul. 31, 2003, EN.L. 16 pages.

Johnson, Chris, "Graphics DDR3 On-Die Termination and Thermal Considerations," Micron Designline, vol. 12, Issue 1, Rev. Apr. 1, 2003, 1Q03/2Q03. 8 pages.

Johnson, Chris, "The Future of Memory: Graphics DDR3 SDRAM Functionality," Micron Designline, vol. 11, Issue 4, 4Q02, Oct. 2002. 8 pages.

JP Office Action dated Dec. 14, 2011 re JP Application No. 2008-547256. 2 Pages. (With Translation).

JP Response dated Mar. 14, 2012 re JP Application No. 2008-547256. 4 pages. (No. Translation).

Khouri, Gaby "Evaluation of Alcatel Patent Portfolio by Semiconductor Insights." Nov. 2004. Copyright Semiconductor Insights Inc. 38 pages.

Kim, Su-Chul, "Programmable Digital On-Chip Terminator." ITC-CSCC, 2002. 4 pages.

Knight et al., "Self-Terminating Low-Voltage Swing CMOS Output Driver," IEEE Journal of Solid-State Circuits, vol. 23, No. 2, Apr. 1988. 8 pages.

Lee, K.H., "MultiMediaCard Solutions of Digital Storage Applications," Samsung Electronics, JEDEX Shanghai, Oct. 26, 2005. 28 pages.

LSI Logic Corporation, Copyright., "Achieving Flexible, High Performance I/O with RapidChip Platform ASICs." 2005. 7 pages.

Micron Technical Note, "DDR2-533 Memory Design Guide for Two-DIMM Unbuffered Systems," TN-47-01, 2003. 19 pages.

Micron Technical Note, "TN-47-07: DDR2 Simulation Support," Rev. A 7/05, 2003. 4 pages.

Micron Technology, Inc., "Graphics DDR3 DRAM," Advance, 256 Mb x 32 GDDR3 DRAM, © 2003, pp. 1-67. 67 pages.

PCT Int'l. Preliminary Report on Patentability (Chapter I of the Patent Cooperation treaty) re PCT/US2006/045966, dated Jul. 3, 2008. 12 pages.

Pericom Semiconductor Corporation, "High Performance Switches: Silicon Switch Product Line Detail," Jul. 2004, Slide Show Presentation. 53 pages.

Rhoden et al., "DDR/DDR2/DDR3 SDRAM Tutorial," Oct. 25-26, 2005, Slide Presentation. 118 pages.

Rhoden, Desi, "VTF 2005: The Evolution of DDR," via Technology Forum 2005, Inphi Corporation, JEDEC 42 Memory Committee. 23 pages.

Samsung Electronics, "512Mb E-die DDR3 SDRAM Specification," Preliminary 512Mb DDR3 SDRAM, Rev. 0.5, Dec. 2006, K4B510846E. 55 pages.

Samsung Electronics, "DDR2 ODT Control," Product Planning & Application Engineering Team, Dec. 2004. 8 pages.

Serial ATA International Organization, "Serial ATA Revision 2.5", dated Oct. 2, 2005. 587 Pages.

Shen, Dr. William Wu, "DDR3 Functional Outlook," Infineon, JEDEX Shanghai, Oct. 25-26, 2005, JEDEC 42.3B Letter Committee, Functional and Features. 30 pages.

Shen, Dr. William Wu, "DDR3 Functional Outlook," JEDEX San Jose, Apr. 2006, JEDEC 42.3B Letter Committee, Functional and Features. 31 pages.

Shen, Dr. William Wu, "System Challenges on DDR3 High Speed Clock/Address/Command Fly-by Bus Topology," JEDEX San Jose, Apr. 18, 2006. 47 pages.

Texas Instruments, Copyright, "LVDS Multidrop Connections, Application Report, Mixed Signal Products (SLLA054)." Jul. 1999. 37 pages.

The International Engineering Consortium, Copyright, "Low-Voltage Differential Signaling." Downloaded from Web ProForum Tutorials http://www.ied.org, Dec. 2005. 15 pages.

Trost, Dr. Hans-Peter, "Press Presentation DDR3 Introduction," Memory Products Group, Infineon Technologies, AG, Jun. 2005. 11 pages.

Weidlich, Rainer, "What Comes Next in Commodity DRAMS-DDR3," Infineon Technologies, Jun. 2005. 4 pages.

Wikipedia dated Mar. 8, 2010, "Serial ATA". 10 pages.

Xilinx Inc., "Xilinx Digitally Controlled Impedance (DCI) Technology," VTT011(v1.1) Sep. 20, 2001, Virtex Tech Topic. 3 pages.

Xilinx, Inc., "Virtex-II Platform FPGAs: Functional Description," Product Specification, DS031-2 (v3.3), Jun. 24, 2004, pp. 1-11, 35-39. 16 pages.

* cited by examiner

INTEGRATED CIRCUIT WITH CONFIGURABLE ON-DIE TERMINATION

FIELD

The subject matter presented herein relates generally to the field of communications, and more particularly to high speed electronic signaling within and between integrated circuit devices.

BACKGROUND

High-speed data communication integrated circuit (IC) dies are known to include both drivers and receivers. The driver of one such IC connects to the receiver of another via one or more signal transmission lines. Both the driver and receiver circuits include termination elements that attempt to match the characteristic impedance of the transmission line to the output impedance of the driver and input impedance of the receiver, as impedance mismatches degrade signal quality and consequently reduce communication speed and reliability.

Some conventional communication systems employ control systems that calibrate the impedance of on-die termination (ODT) elements for improved impedance matching. These systems work well in many applications. Still, high-speed data communication circuits often must achieve ever-greater performance levels, at competitive prices, to satisfy customer demand. Furthermore, different customers typically have different requirements that may not be met by a given ODT configuration. One customer might favor power-efficiency over speed, or may prefer different termination voltages or impedances. There is therefore a need for ODT circuits that offer customers access to a broader range of termination topologies and values.

BRIEF DESCRIPTION OF THE DRAWINGS

The subject matter presented herein is illustrated by way of example, and not by way of limitation, in the figures of the accompanying drawings and in which like reference numerals refer to similar elements and in which.

DETAILED DESCRIPTION

Figure 1:
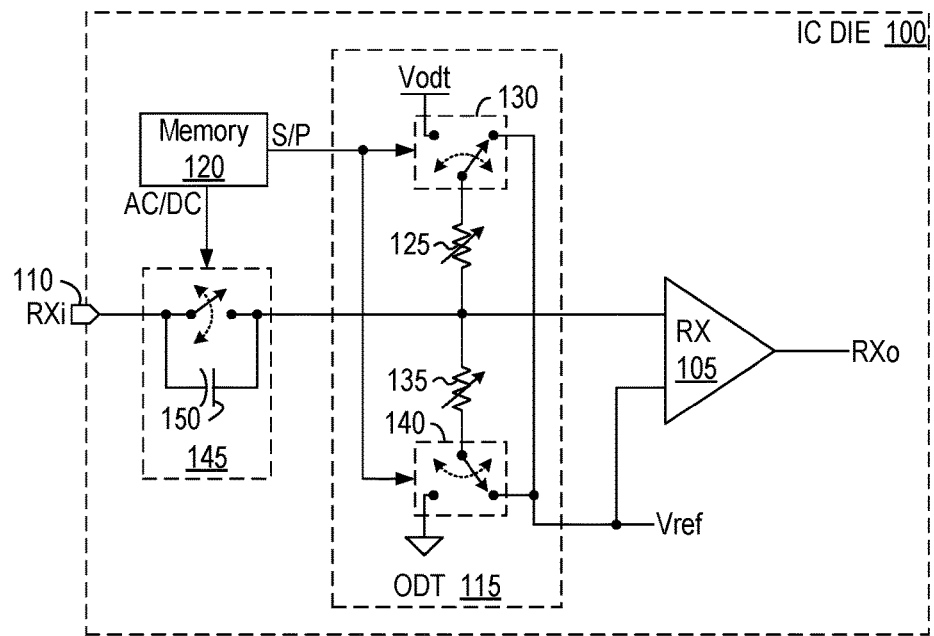
FIG. 1 depicts an integrated-circuit die 100 that includes configurable on-die termination in accordance with one embodiment.

FIG. 1 depicts an integrated-circuit (IC) die 100 in accordance with one embodiment. Die 100 includes a pseudo-differential receiver 105 that compares an input signal RXi, received via a pad 110, with a reference voltage Vref on a like-named voltage terminal or node to produce an output signal RXo. Die 100 also includes programmable on-die termination (ODT) circuitry 115 that can be programmed to provide either of two common termination topologies for high-speed communications: the so-called "rail-to-rail" topology and the so-called "half-supply" topology. The choice of termination topology is then left to the discretion of the user of IC die 100. An external source or internal memory 120 can deliver a signal S/P to temporarily or permanently select one of the two configurations.

ODT circuitry 115 includes two termination legs extending from the communication port between pad 110 and receiver 105. The upper termination leg includes a first termination impedance 125 and a first termination switch 130. Switch 130 includes three switch nodes, two of which are connected to supply voltage Vodt and reference voltage Vref, respectively. The third switch node is coupled to the communication port via termination impedance 125. The lower termination leg includes a second termination impedance 135 and a second termination switch 140 similar to switch 130. Two switch nodes of switch 140 are connected to ground and reference voltage Vref, respectively, while the third is coupled to the communication port via termination impedance 135. Both switches 130 and 140 are two position switches responsive to signal S/P from memory 120 to selectively couple one of the first and second switch nodes to the third switch node.

In rail-to-rail or serial terminations, the communication channel is coupled to each of two opposite supply voltages via a pair of termination impedances. To select a rail-to-rail termination topology, switches 130 and 140 are switched to supply nodes Vodt and ground, respectively. In that case, the input terminal to receiver 105 is coupled to Vodt and ground via respective impedances 125 and 135. Termination voltage Vodt on the like-named supply node is supply voltage Vdd in some embodiments, but may be a different fixed voltage or a variable voltage in other embodiments.

In half-supply or parallel terminations, the communication channel is coupled to a reference voltage between the two supply voltages. To select a half-supply termination topology, switches 130 and 140 are both switched to voltage Vref, in which case the input terminal to receiver 105 is coupled to the reference voltage terminal Vref via parallel impedances 125 and 135. As the name implies, the reference voltage in half-supply terminations is typically half the difference between the voltages on the supply nodes (e.g., Vref=½ (Vdd−Gnd)), but voltage Vref may be a different fixed voltage or a variable voltage in other embodiments.

IC die 100 optionally includes a coupling switch 145 between pad 110 and the input terminal of receiver 105. An external or internal signal, such as from memory 120, can deliver a signal AC/DC to temporarily or permanently open or close switch 145. When switch 145 is closed, receiver 105 is DC coupled to pad 110: when open, receiver 105 is AC coupled to pad 110 via a capacitor 150.

Impedances 125 and 135 may be adjustable and capable of calibration. Suitable calibration methods and circuits are detailed in U.S. Pat. No. 6,924,660 entitled "Calibration Methods and Circuits for Optimized On-Die Termination," which is incorporated herein. Switches 130, 140, and 145 can be fashioned of transistors, as is well understood by those of skill in the art. Capacitor 150 may also be adjustable using methods and circuits detailed below in connection with FIG. 6.

Figure 2:
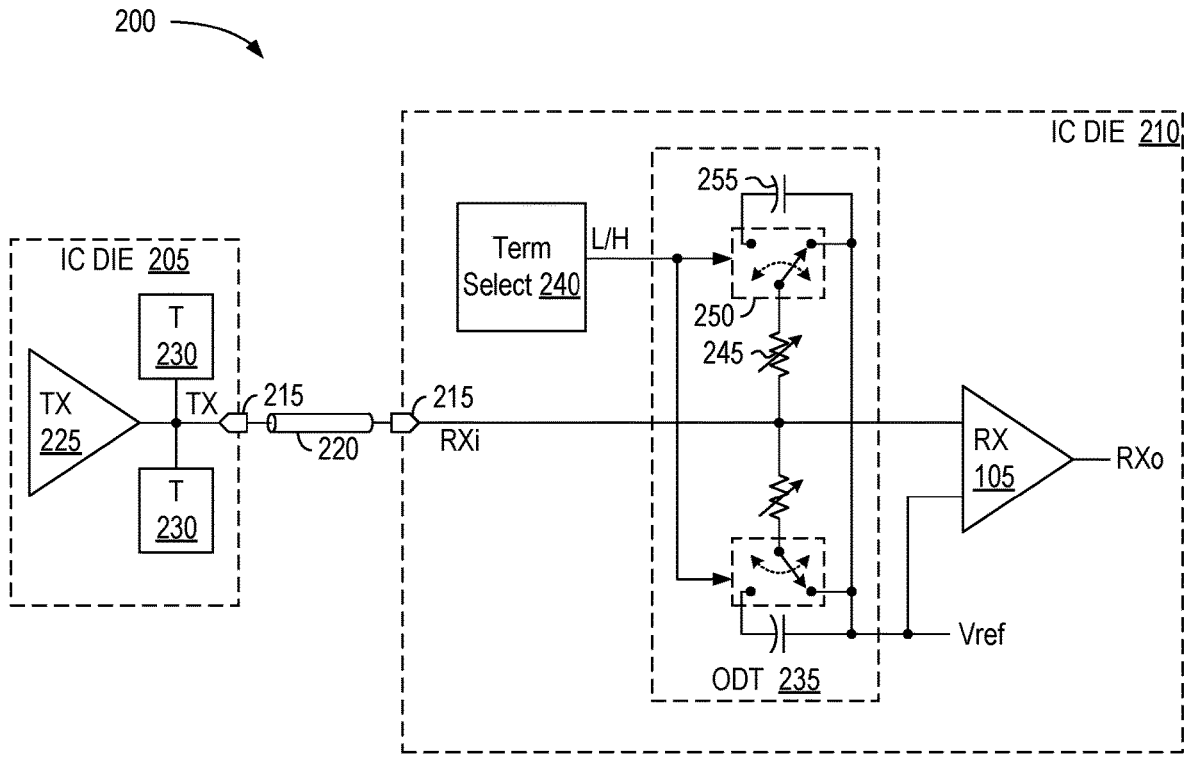
FIG. 2 depicts a communication system 200 that employs configurable on-die termination in accordance with another embodiment.

FIG. 2 depicts a communication system 200 in accordance with another embodiment. System 200 has features in common with IC die 100 of FIG. 1, like-numbered elements being the same or similar. System 200 includes ODT circuitry that can selectively introduce filter elements that may be useful for low power configurations. Further, the selection can be accomplished dynamically in some embodiments, which allows system 200 to select appropriate ODT characteristics for high and low-frequency communication. This flexibility is useful for example in systems that support both a low-frequency, power-saving mode and a high-frequency, high-performance mode.

System 200 includes a transmitter IC die 205 coupled to a receiver IC die 210 via a single-ended communication port made up of pads 215, a channel 220, and related conductors on dies 205 and 210. Die 205 includes a transmitter 225 and a pair of termination legs 230. Legs 230 may be the same or similar to the termination legs detailed in connection with the receiver dies 100 and 210 of FIGS. 1 and 2. Transmitter 225 conveys a signal TX to receiver 105 on die 210 via pad 215 and the other elements of the associated communication port.

IC die 210 includes ODT circuitry 235 that can select either a filtered or unfiltered half-supply termination topology. The termination topology is then left to the discretion of the user of IC die 210. The topology may be fixed, defined at start up, or allowed to change dynamically to support different performance modes. In the depicted embodiment, termination select logic 240 issues a control signal L/H, the state of which identifies either a lower-performance, lower-power mode, or a higher-performance, higher-power mode.

ODT circuitry 235 includes two termination legs extending from the communication port between pad 215 and receiver 105 of die 210. The upper termination leg includes a first termination impedance 245 and a first termination switch 250. Switch 250 includes three switch nodes, two of which are connected to reference voltage Vref, one directly and the other via a filter capacitor 255. The third switch node is coupled to the communication port via termination impedance 245. The lower termination leg is substantially the same. The switches of the upper and lower termination legs are responsive to signal L/H from termination select logic 240.

The switches of both termination legs connect their respective termination resistors directly to voltage node Vref in a high-performance mode, and to voltage node Vref via a respective filter capacitor in a low-frequency mode. Filtering the input signal in the low-frequency mode advantageously dampens high-frequency noise components. The filter capacitors may be adjustable in some embodiments to allow filter tuning. Fixed or adjustable resistors in series and/or in parallel with the filter capacitors can also be included.

Figure 3:
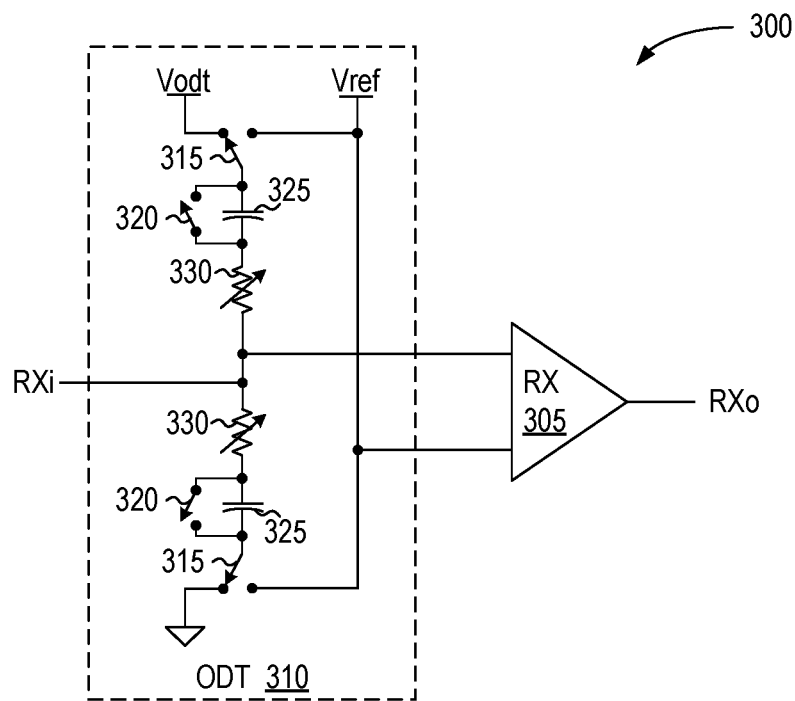
FIG. 3 depicts an IC die 300 in accordance with another embodiment.

FIG. 3 depicts an IC die 300 in accordance with another embodiment. Die 300 includes a receiver 305 that compares an input signal RXi with a reference voltage Vref on a like-named voltage node to produce an output signal RXo. Die 300 also includes programmable ODT circuitry 310 that can be programmed to provide filtered or unfiltered rail-to-rail or a half-supply termination topologies, and thus combines the functionality of the embodiments of FIGS. 1 and 2.

ODT circuitry 310 includes two termination legs. Each leg includes switches 315 and 320, a filter capacitor 325, and a termination impedance 330. Switches 315 and 320 support four modes as follows:

1. Unfiltered Rail-to-Rail: Switches 320 are closed and switches 315 of the upper and lower termination legs select nodes Vodt and Ground, respectively.
2. Filtered Rail-to-Rail: Switches 320 are open and switches 315 of the upper and lower termination legs select nodes Vodt and Ground, respectively.
3. Unfiltered Half-Supply: Switches 320 are closed and switches 315 both select node Vref.
4. Filtered Half-Supply: Switches 320 are open and switches 315 both select node Vref.

ODT circuitry 310 can be adapted to support more modes. Additional supply voltages can be supported, for example, and the impedances and capacitances can be adjustable.

Figure 4:
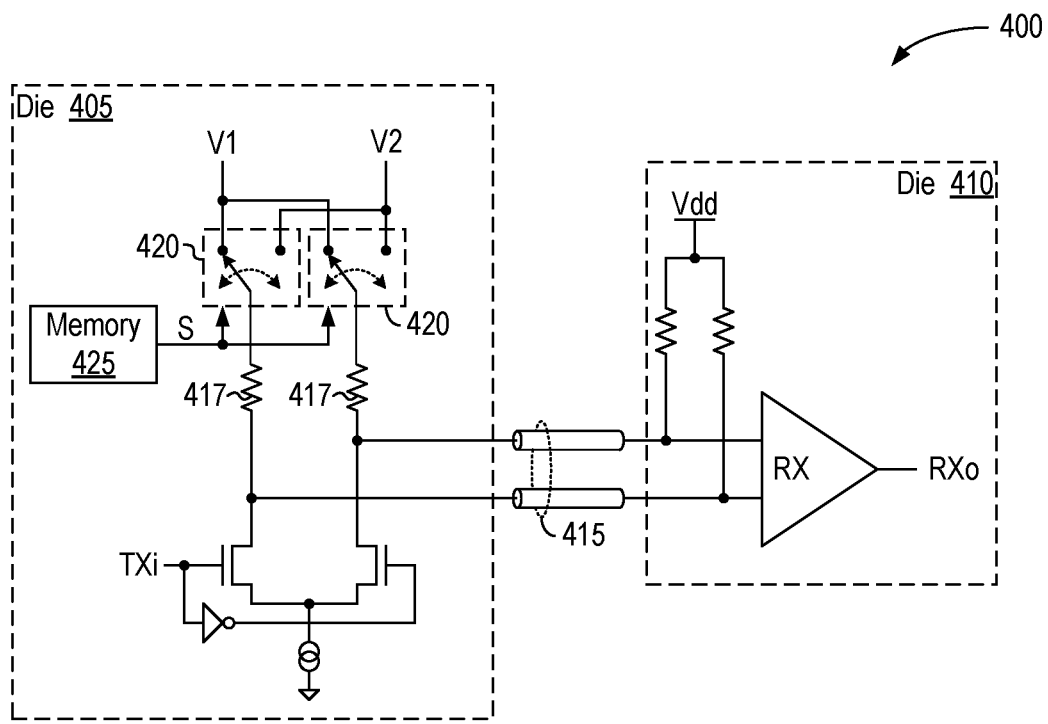
FIG. 4 depicts a communication system 400 that employs configurable ODT circuitry in accordance with another embodiment.

FIG. 4 depicts a communication system 400 that employs configurable ODT circuitry in accordance with another embodiment. The configurable ODT circuitry allows a transmitter die 405 to select between two or more termination voltages when transmitting data to a receiver die 410 over a differential communication channel 415. The resulting output common-mode voltage can thus be tailored to the needs of a receiver on die 410. If, for example, multiple receivers timeshare a common bus but require or benefit from different receive termination voltages, then the associated transmitter or transmitters can use the termination voltage best suited for the receiver with which they are communicating. A communication channel may also support different operational modes that require or benefit from different termination voltages. A transmitter might, for example, support a loop-back communication mode for self test or initialization that employs a first termination voltage, and additionally support one or more operational modes that employ different termination voltages suitable for one or more target receivers.

Die 405 includes a differential transmitter with two identical or nearly identical termination legs. Each leg includes a fixed or adjustable termination impedance 417 and a voltage-select switch 420. The state of switches 420 are controlled using select signal S that may be provided externally or internally, as by a memory 425. Control logic can be included to dynamically alter the states of switches 420, which can alternatively select either of two termination voltages V1 and V2. In other embodiments, a variable voltage source is used in lieu of switches 420 and the two supply nodes.

Figure 5:
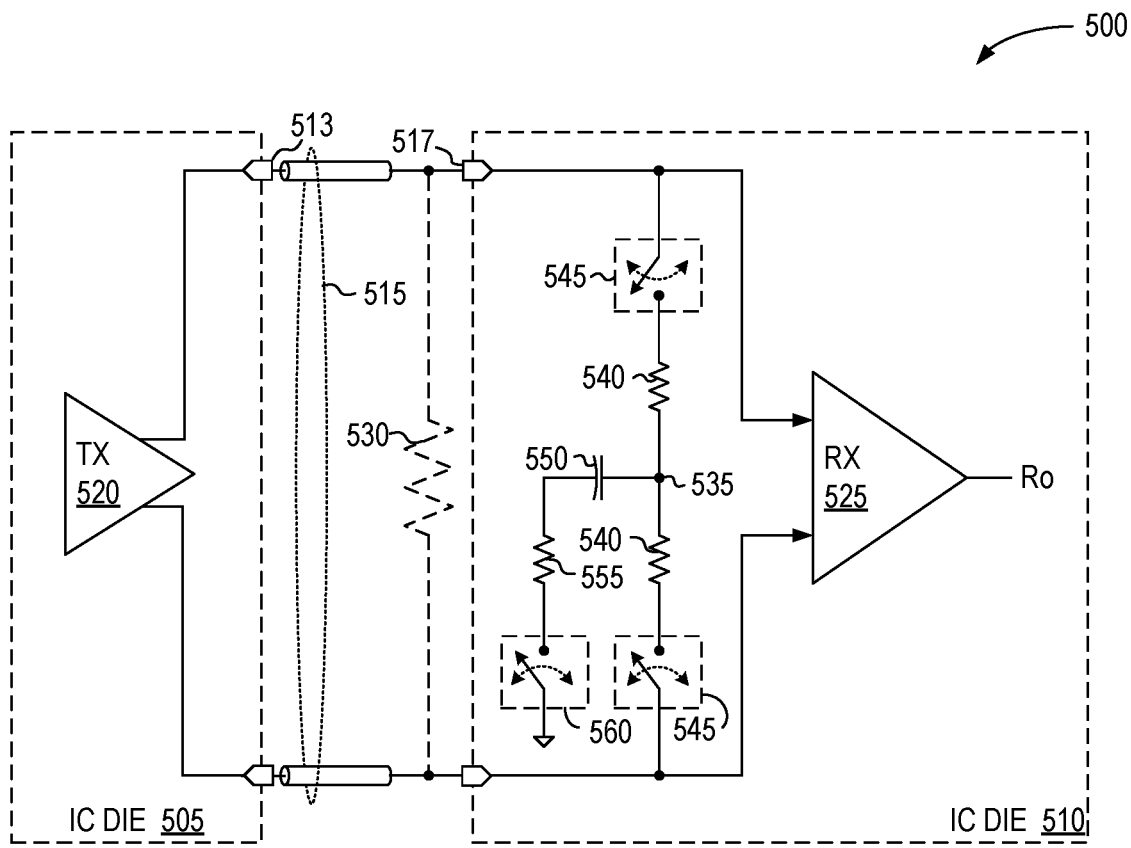
FIG. 5 depicts a communication system 500 in accordance with yet another embodiment.

FIG. 5 depicts a communication system 500 in accordance with yet another embodiment. Communication system 500 includes a transmitting die 505 communicating with a receiving die 510 via a differential channel 515. The transmitting die includes differential output pads 513 coupled via the channel to input pads 517 of the receiving die. In one embodiment, communication system 500 includes a transmitter 520 that employs low-voltage differential signaling (LVDS) for serial data transmission to a corresponding receiver 525, though other types of signaling may also be used. System 500 optionally includes an external differential termination resistor 530 (in phantom).

Die 510 includes programmable ODT circuitry that can select from a number of possible termination topologies. In support of this selectivity, die 510 includes three termination legs that extend from a common node 535, two to the differential input terminals to receiver 525 and one to a reference voltage node, e.g. ground. Each of the first two termination legs includes a termination impedance 540 and a switch 545 connected in series. The third termination leg includes a capacitance 550, a termination impedance 555, and a switch 560. The inclusion of impedances 540 and as associated switches 545 allows for the omission of external resistor 530. The third leg allows for the selective incorporation of a noise-reducing RC filter. The impedances and capacitance of the ODT circuitry of FIG. 5 are variable in some embodiments, which allows filter and termination values to be trimmed for improved performance. Switches 545 and 560 can be controlled by external or internal control signals applied to switch control terminals (not shown). The various capacitive and resistive elements can be similarly controlled.

Figure 6:
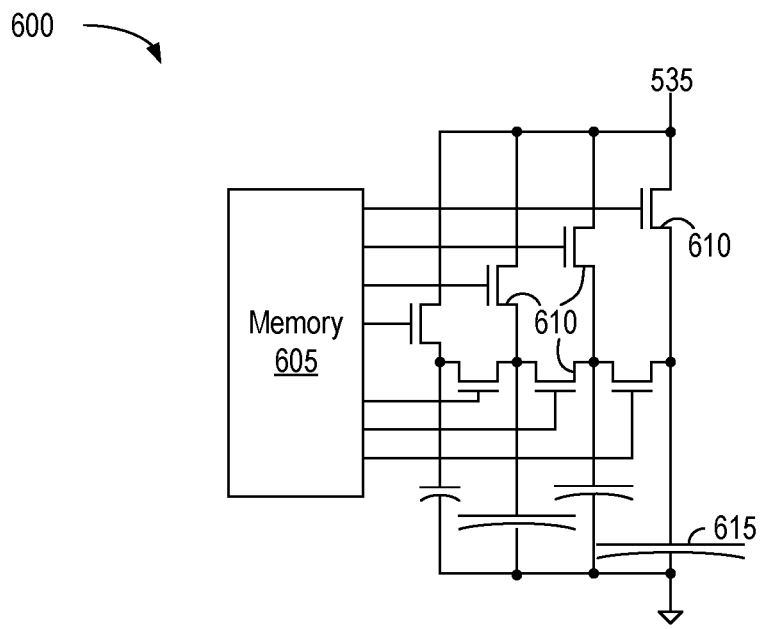
FIG. 6 depicts a configurable RC circuit 600 that can be used in place of the third termination leg of die 510 of FIG. 5, which extends between node 535 and ground.

FIG. 6 depicts a configurable RC circuit 600 that can be used in place of the third termination leg of die 510 of FIG. 5, which extends between node 535 and ground. Circuit 600 includes some memory 605, the outputs of which are coupled to the control terminals of a plurality of transistors 610. The transistors 610 selectively couple one or more differently sized capacitors 615 between node 535 and ground. In addition to controlling the capacitance, the resistance between nodes 535 and ground can be adjusted by selecting various combinations of transistors. The width-to-length ratios of transistors 610 may be varied to provide various impedances so that enabling different combinations of transistors provides different levels of termination impedance.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, the embodiments can be adapted for use with various single-ended and differential communication schemes over unidirectional and bidirectional channels. Specific examples include Series Stub Terminated Logic (SSTL) and double-data-rate (DDR) signaling, though this is by no means an exhaustive list. Embodiments may also be used for channels employing various modulation schemes, including those that employ multi-pulse-amplitude-modulation (multi-PAM) and single-PAM signals. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. An integrated-circuit die comprising:
a receiver having an input terminal and an output terminal;
a first switch having a first node coupled to a reference, a second node, and a third node, wherein the first switch selectively couples the first node to the third node and selectively couples the second node to the third node;
a first termination element coupled between the third node and the input terminal;
a second switch having a fourth node coupled to the reference, a fifth node, and a sixth node, wherein the second switch selectively couples the fourth node to the sixth node and selectively couples the fifth node to the sixth node; and
a second termination element coupled between the sixth node and the input terminal.

2. The die of claim 1, wherein the first switch couples the first and third nodes and the second switch couples the fourth and sixth nodes in a serial termination configuration, and wherein the first switch couples the second and third nodes and the second switch couples the fifth and sixth nodes in a parallel termination configuration.

3. The die of claim 2, wherein the first switch and the second switch include respective first and second control terminals.

4. The die of claim 3, further comprising a register with an output port coupled to the first and second control terminals, the register to store a value that determines whether the first and second switches support the parallel termination configuration or the series termination configuration.

5. The die of claim 1, further comprising a first reference-voltage node coupled to the second node and a second reference-voltage node coupled to the fifth node.

6. The die of claim 1, further comprising a third switch and a capacitor coupled in parallel between the pad and the input terminal of the receiver.

7. A communication system comprising:
a first IC die having:
   an output pad; and
   a transmitter coupled to the output pad to transmit data on the output pad;
a second IC die having:
   an input pad; and
   a receiver coupled to the input pad to receive the transmit data;
a communication channel extending between the output pad of the first IC die and the input pad of the second IC die; and
a termination circuit integrated with one of the first and second IC dies and coupled to a respective one of the output pad and the input pad, the termination circuit including:
   a first switch having a first node coupled to a first reference, a second node, and a third node, wherein the first switch selectively couples the first node to the third node and selectively couples the second node to the third node;
   a first termination element coupled between the third node and the input pad;
   a second switch having a fourth node coupled to a second reference, a fifth node, and a sixth node, wherein the second switch selectively couples one of the fourth node to the sixth node and selectively couples the fifth nodes node to the sixth node; and
   a second termination element coupled between the sixth node and the input pad.

8. The communication system of claim 7, wherein the first switch couples the first and third nodes and the second switch couples the fourth and sixth nodes in a serial termination configuration, and wherein the first switch couples the second and third nodes and the second switch couples the fifth and sixth nodes in a parallel termination configuration.

9. The communication system of claim 8, wherein the first and second switches include respective first and second control terminals.

10. The communication system of claim 9, further comprising a register with an output port coupled to the first and second control terminals, the register to store a value that determines whether the first and second switches support a parallel termination configuration or a series termination configuration.

11. The communication system of claim 7, further comprising a first reference-voltage node coupled to the second node and a second reference-voltage node coupled to the fifth node.

12. The communication system of claim 7, further comprising a capacitor coupled between the first and second nodes.

13. An integrated-circuit die comprising:
a pad to receive an input signal to the die;
a receiver having an input terminal coupled to the pad, a reference, and an output terminal;
a first switch having a first control terminal, a first node coupled to the reference, a second node, and a third node, wherein the first switch selectively couples the first node to the third node and selectively couples the second node to the third node;
a first termination element coupled between the third node and the input terminal;
a second switch having a second control terminal, a fourth node coupled to the reference, a fifth node, and a sixth node, wherein the second switch selectively couples the fourth node to the sixth node and selectively couples the fifth node to the sixth node;
a second termination element coupled between the sixth node and the input terminal; and
a register with an output port coupled to the first control terminal, the register to store a value that determines whether the first switch supports a parallel termination configuration or a series termination configuration.

14. The integrated-circuit die of claim 13, wherein the register output port is coupled to the second control terminal and the value determines whether the second switch supports the parallel termination configuration or the series termination configuration.

15. The integrated-circuit die of claim 13, wherein the first termination element includes a tunable capacitance.

16. The integrated-circuit die of claim 15, wherein the output port of the register is coupled to the first termination element, and wherein the value selects from among a range of capacitances for the tunable capacitance.

17. The integrated-circuit die of claim 13, wherein the register output port is coupled to the first termination element, and wherein the value determines a resistance of the termination element.

18. The integrated-circuit die of claim 13, wherein the input terminal of the receiver is coupled to the pad via a third switch.

19. The integrated-circuit die of claim 18, further comprising a capacitor coupled in parallel with the third switch.

20. The integrated-circuit die of claim 18, wherein the capacitor is tunable over a range of capacitances.

* * * * *